(12) United States Patent
Nishida et al.

(10) Patent No.: US 9,992,886 B2
(45) Date of Patent: Jun. 5, 2018

(54) WATERPROOF TYPE CONTROL APPARATUS

(71) Applicants: Mitsubishi Electric Corporation, Tokyo (JP); YAZAKI CORPORATION, Tokyo (JP)

(72) Inventors: Mitsunori Nishida, Tokyo (JP); Osamu Nishizawa, Tokyo (JP); Wataru Tamura, Tokyo (JP); Keishi Jinno, Shizuoka (JP); Kouichi Ohyama, Shizuoka (JP)

(73) Assignees: Mitsubishi Electric Corporation, Tokyo (JP); YAZAKI CORPORATION, Tokyo (JP)

( * ) Notice: Subject to any disclaimer, the term of this patent is extended or adjusted under 35 U.S.C. 154(b) by 0 days. days.

(21) Appl. No.: 15/204,121

(22) Filed: Jul. 7, 2016

(65) Prior Publication Data

US 2017/0223847 A1    Aug. 3, 2017

(30) Foreign Application Priority Data

Feb. 1, 2016    (JP) ................. 2016-016844

(51) Int. Cl.
*H05K 5/02*    (2006.01)
*H05K 5/03*    (2006.01)
*H05K 5/00*    (2006.01)

(52) U.S. Cl.
CPC ......... *H05K 5/0213* (2013.01); *H05K 5/0069* (2013.01); *H05K 5/0247* (2013.01); *H05K 5/03* (2013.01)

(58) Field of Classification Search
CPC .. H05K 5/0213; H05K 5/0069; H05K 5/0247; H05K 5/03
See application file for complete search history.

(56) References Cited

U.S. PATENT DOCUMENTS 6,113,407 A * 9/2000 Martin ................. H01R 13/521
439/205
6,827,232 B1 * 12/2004 Hara ................. B29C 45/14336
220/371

(Continued)

FOREIGN PATENT DOCUMENTS

JP    2000-228243 A        8/2000
JP    2000228243 A    *    8/2000

(Continued)

*Primary Examiner* — Hoa C Nguyen
*Assistant Examiner* — Keith Depew
(74) *Attorney, Agent, or Firm* — Sughrue Mion, PLLC; Richard C. Turner

(57) ABSTRACT

A circuit board is sealed and housed in a casing including a base and a cover, a connector housing including a partition wall is mounted on the circuit board, and an electrical connection between the interior and the exterior of the casing is established. A water-repellent filter is fixed to an inner surface of the partition wall, an outer surface portion of the water-repellent filter is opened to atmosphere via the breath ventilation hole, and an atmospheric opening surface thereof is formed such that the atmospheric opening surface being wetted directly with water is avoided by a poured water blocking wall and water barrier walls. A position where the poured water blocking wall is provided is changed by an insert mold in response to the direction of the mounting surface of the base.

7 Claims, 10 Drawing Sheets

(56) References Cited

U.S. PATENT DOCUMENTS

| | | | | |
|---|---|---|---|---|
| 7,442,334 B2* | 10/2008 | Hara | ................ | B29C 45/14639 |
| | | | | 264/241 |
| 7,667,973 B2* | 2/2010 | Shinoda | ............... | H05K 5/0047 |
| | | | | 174/50 |
| 7,744,381 B2* | 6/2010 | Honda | ................ | H05K 5/0052 |
| | | | | 439/79 |
| 7,936,566 B2* | 5/2011 | Shigyo | ................ | H05K 5/0052 |
| | | | | 137/14 |
| 8,014,158 B2* | 9/2011 | Kojima | ............... | H05K 5/0052 |
| | | | | 174/50.5 |
| 8,520,397 B2* | 8/2013 | Azumi | ................ | H05K 5/0052 |
| | | | | 361/730 |
| 8,627,564 B2* | 1/2014 | Blossfeld | ........... | H01R 13/6658 |
| | | | | 29/592.1 |
| 8,699,231 B2* | 4/2014 | Shinoda | ............... | H05K 5/0047 |
| | | | | 174/520 |
| 9,293,870 B1* | 3/2016 | Koczwara | ............ | H01R 12/724 |
| 9,462,715 B2* | 10/2016 | Nuriya | ................... | H05K 5/061 |

FOREIGN PATENT DOCUMENTS

| | | | |
|---|---|---|---|
| JP | 2005150376 A | * | 6/2005 |
| JP | 2005243829 A | * | 9/2005 |
| JP | 2007141959 A | * | 6/2007 |
| JP | 2011-165748 A | | 8/2011 |
| JP | 2014164825 A | * | 9/2014 |

\* cited by examiner

WATERPROOF TYPE CONTROL APPARATUS

BACKGROUND OF THE INVENTION

FIELD OF THE INVENTION

Technical Field

The present invention relates to a waterproof type control apparatus that is, for example, an on-vehicle electronic control apparatus provided in an engine room, and particularly relates to improvement in a breath ventilation structure in which a water-repellent filter is provided between the interior of a waterproof sealed casing having a heating component housed therein and outside air to protect a waterproof sealing structure.

DESCRIPTION OF THE RELATED ART

Background Art

In a waterproof type control apparatus in which a circuit board is sealed and housed in a casing that includes a base and a cover, circuit components, including a heating component, and an external wiring connector housing exposed partially from the casing are mounted on the circuit board, and a waterproof sealing material is provided on a joined surface of the base, the cover, and the connector housing, a water-repellent filter is conventionally provided to the cover or the base to release air within the casing to the atmosphere, so that deformation of a casing structure or damage of an airtight sealing structure caused due to an air pressure difference between the interior and the exterior of the casing based on an increase in the temperature of the heating component within the casing, is prevented.

The water-repellent filter is composed of a flat porous material including a plurality of fine pores that block entry and passing of water droplets into the casing and allow the atmospheric air to freely pass therethrough, and a mounting structure for the porous material is devised such that the porous material is not stained through wetting directly with water.

As one of widely-used forms, there is one having a water-repellent filter provided at the cover side. However, the cover is most likely to be wetted directly with water, and thus a ventilation structure for withstanding wetting directly with water poured by high-pressure washing or the like is required. This structure becomes complicated and expensive, which is a problem.

As another widely-used form, there is one having a water-repellent filter provided at a back surface portion of the base. In this case, the position of the water-repellent filter is an advantageous position where it is hard to be wetted directly with water poured by high-pressure washing. However, in the case where the base is made of a sheet metal or an aluminum die casting, there is a problem that it is difficult to bond and fix the water-repellent filter alone.

In addition, in the case were the base is made of a resin, the water-repellent filter can be fixed easily by means of heat welding, but there is a problem that heat generated within the casing cannot be transmitted and dissipated.

Meanwhile, the vicinity of the connector housing to which a wire harness is connected is a position where it is hard to be wetted directly with water, and is a most advantageous location where consideration is given to a surrounding structure.

For example, according to FIG. 1 of the "ventilation structure of waterproof case" of Patent Document 1 described below, a connector 20 of a wire harness 19 has a plurality of ventilation holes 23 formed for causing the interior of the connector 20 to communicate with the atmosphere, and a water-repellent filter 24 having air permeability and waterproofness is mounted at each of the ventilation holes 23 by means of welding. A connector 17 of a circuit board 16 housed in a waterproof case 11 has one or a plurality of communication holes 25 formed so as to provide communication between the interior of the connector 20 of the wire harness 19 and the interior of the waterproof case 11. Both the interior of the waterproof case 11 and the interior of the connector 20 are caused to communicate with the atmosphere by the ventilation holes 23 and the communication holes 25 of the connectors 20 and 17, so that water suction caused due to a negative pressure can be prevented and both a short circuit within the connector 20 and a short circuit of the circuit board 16 can be prevented.

According to FIGS. 9 and 12 of the "waterproof casing" of Patent Document 2 described below, a cover 18 of a waterproof casing 300 having an electronic board 15 housed therein is provided with a ventilation hole 20, a breathing filter 10 that includes a double-sided adhesive sealing material 11 and a filter body 12 is disposed on the outer surface of the cover 18, and a ventilation groove 26 that leads to the breathing filter 10 and has a slope is closed by a shield 24, except for an end opening of the ventilation groove 26.

Therefore, since the breathing filter includes the ventilation groove having a maze structure and the shielding body, it is not necessary to provide a plurality of ventilation holes in the casing and provide a breathing filter over two surfaces as in the conventional art. Accordingly, the breathing filter can be reduced in size to reduce the cost, and also clogging of the breathing filter can be reduced.

CITATION LIST

Patent Document

Patent Document 1: Japanese Laid-Open Patent Publication No. 2000-228243 (FIG. 1, paragraphs [0013] to [0016])

Patent Document 2: Japanese Laid-Open Patent Publication No. 2011-165748 (FIGS. 8 to 12, paragraphs [0058] to [0063])

SUMMARY OF THE INVENTION

Problems to be Solved by the Invention (1) Explanation of Problems of Conventional Arts In the "ventilation structure of the waterproof case" according to Patent Document 1 described above, the water-repellent filters 24 are mounted at the connector 20 side, and both the interior of the waterproof case 11 and the interior of the connector 20 are caused to communicate with the atmosphere, so that both a short circuit within the connector 20 and a short circuit of the circuit board 16 that are caused due to water suction are prevented.

Therefore, although each water-repellent filter 24 is provided at the location where it is hard to be wetted directly with water, since each water-repellent filter 24 is provided in a small space within the connector 20, there is a problem that the ventilation area of each water-repellent filter 24 decreases, so that an air pressure difference occurs between the interior of the waterproof case 11 and the atmosphere.

In addition, the waterproof type control apparatus itself does not include a water-repellent filter, and thus there is a problem that a functional test cannot be conducted on the apparatus alone.

In the case of the "waterproof casing" according to Patent Document 2 described above, the breathing filter 10 (corresponding to a water-repellent filter) having the ventilation hole with a maze structure is provided on a proximate back surface of an intermediate portion between connector housings 17a and 17b and at the cover 18 side, and an atmospheric opening thereof is the intermediate portion between the connector housings 17a and 17b.

Therefore, although the atmospheric opening is a location where it is hard to be wetted directly with water, the cover 18 needs an opening wall surface that is in contact with the connector housings 17a and 17b and an inner wall surface to which the breathing filter 10 is bonded and fixed and which has a ventilation hole 20, so that the cover shape is complicated. Thus, there is a problem that it is difficult to apply this cover shape to at least a cover made of a sheet metal.

In addition, depending on a direction in which the waterproof casing is mounted, the atmospheric opening may be wetted directly with water, and there is a problem that application to a use with such a mounting angle is impossible.

(2) Explanation of Objects of Invention

A first object of the present invention is to provide a water-repellent filter mounting structure with which a water-repellent filter is mounted within a waterproof type control apparatus and which can avoid an atmospheric opening from being wetted directly by water, without needing a complicated mounting structure.

A second object of the present invention is to provide a water-repellent filter mounting structure that can handle various mounting positions and mounting angles of a waterproof type control apparatus in various uses to avoid wetting directly with water.

Solution to the Problems

A waterproof type control apparatus according to the present invention includes: a circuit board sealed and housed in a casing including a cover and a base having a mounting surface; a connector housing which is a resin molded member mounted at one side of the circuit board and exposed from a side surface opening of the cover; and a plurality of first connection terminals press-fitted into a partition wall of the connector housing, wherein one end of each first connection terminal is connected to a circuit pattern of the circuit board, and another end of each first connection terminal is connected in a contact conductive manner to a second connection terminal provided within a mating connector, so that the waterproof type control apparatus is connected to a wire harness which is outside the casing, the connector housing includes an outer annular peripheral wall which is provided at an outer side of the partition wall and to which the mating connector is fitted, and a waterproof packing for preventing water from entering an closed space including a contact conductive portion between each first connection terminal and each second connection terminal is provided between an end surface portion of the outer annular peripheral wall and the mating connector.

In addition, a water-repellent filter which is a flat porous material including a plurality of fine pores which block entry and passing of water droplets into the casing and allow atmospheric air to freely pass therethrough is fixed in a close contact manner to an inner wall of the partition wall; the water-repellent filter includes an inner surface portion communicating with an inner space of the casing and an outer surface portion communicating with a breath ventilation hole through which outside air is introduced; at the breath ventilation hole, water barrier walls are disposed at three sides of an atmospheric opening surface penetrating the partition wall, and a poured water blocking wall is disposed which partially or fully blocks either one of poured water in a first direction flowing from a cover side plane to a base side plane or poured water in a second direction flowing from the base side plane to the cover side plane and releases the other poured water; and a regular product in which the poured water blocking wall partially or fully blocks the poured water in the first direction or a mirror-image product in which the poured water blocking wall partially or fully blocks the poured water in the second direction is used depending on whether the base is mounted on a floor surface or a ceiling surface.

Effect of the Invention

In the waterproof type control apparatus according to the present invention, since the water-repellent filter is mounted on the inner surface of the connector housing, a functional test can be conducted on the apparatus alone, and also there is an effect that the area of the water-repellent filter can be increased to reduce the air pressure difference between the interior and the exterior, as compared to the case where the water-repellent filter is provided within the mating connector.

In addition, the mounting structure for the water-repellent filter becomes simpler and cheaper, so that there is an effect that a cover made of a resin or a sheet metal can be used.

In addition, the position and the direction of the poured water blocking wall can be selected by changing an insertion position of an insert relative to a mold dedicated for the regular product or the mirror-image product or a shared mold, the breath ventilation hole can be formed by the molded structure of the connector housing, and the mounting environment can be handled by using the water-repellent filter having a simple configuration such that wetting directly by water from the atmospheric opening surface is avoided. Thus, there is an effect that in either case, the common base and cover can be used.

DETAILED DESCRIPTION OF THE PREFERRED EMBODIMENTS

Embodiment 1

Figure 1:
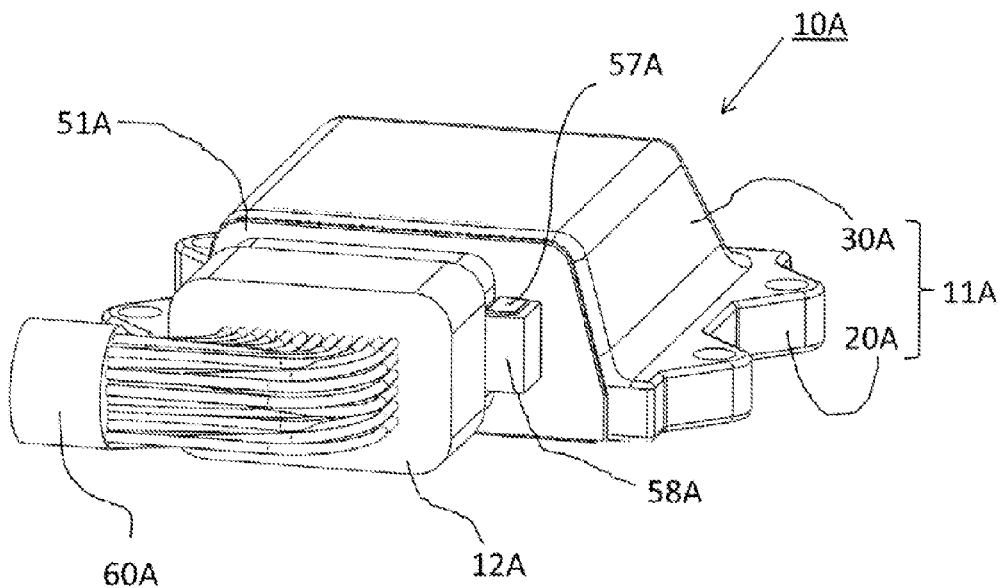
FIG. 1 is an external view of a waterproof type control apparatus according to Embodiment 1 of the present invention.
Figure 2:
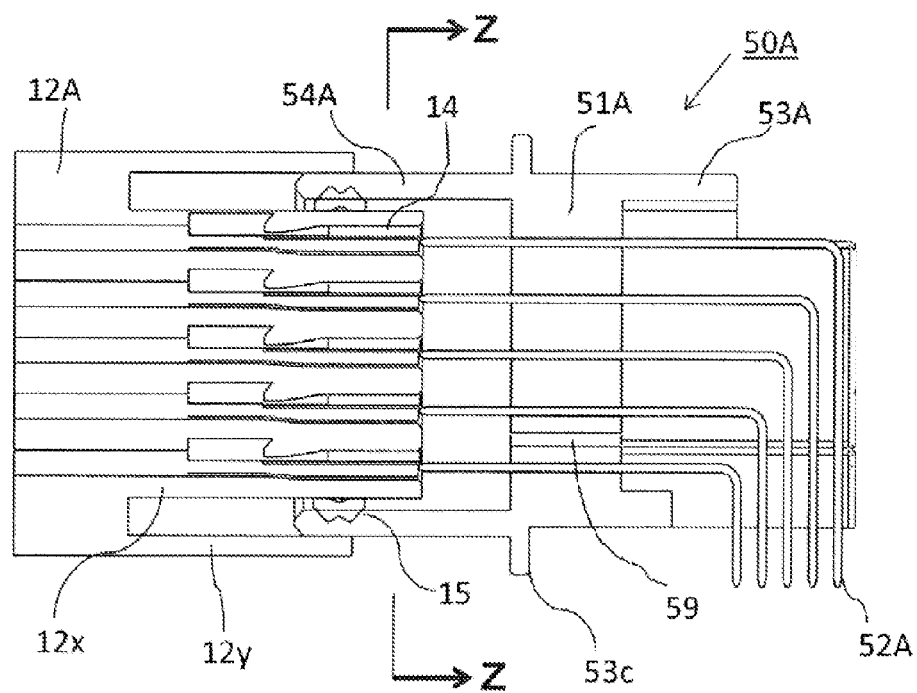
FIG. 2 is a cross-sectional view of a connector connection portion in FIG. 1.
Figure 3:
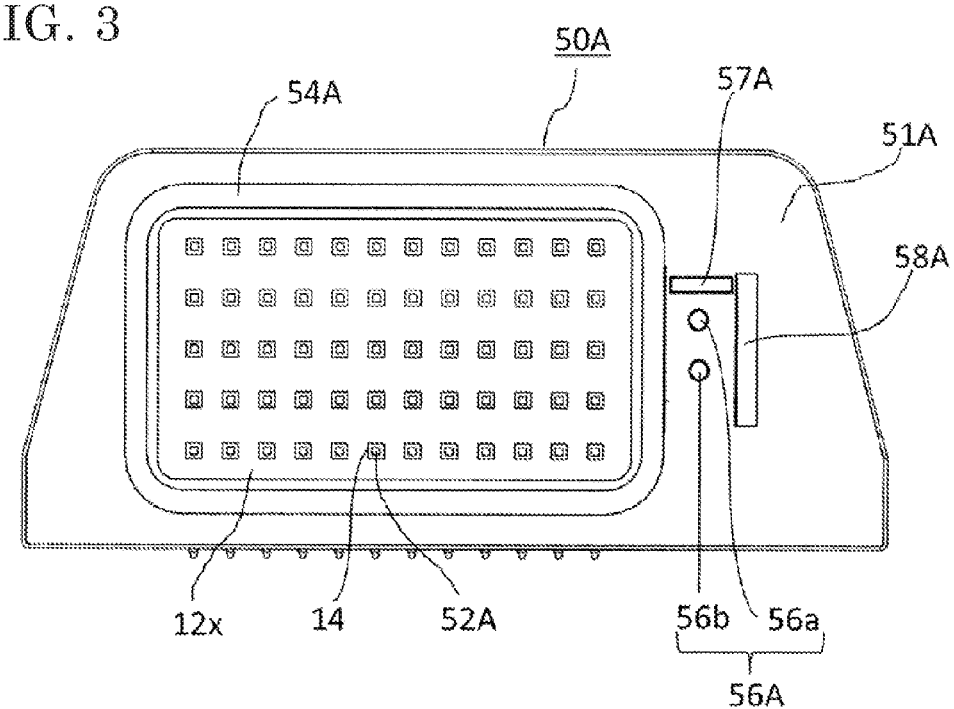
FIG. 3 is a cross-sectional view taken along a Z-Z line in FIG. 2.
Figure 4:
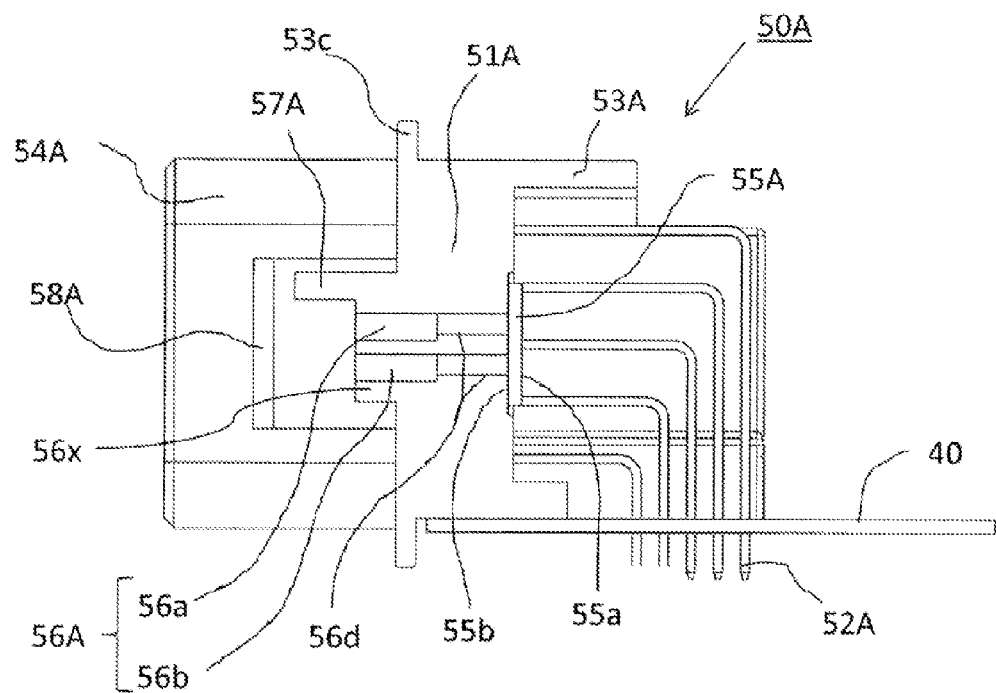
FIG. 4 is a detailed cross-sectional view of a connector housing in FIG. 1.
Figure 5A:
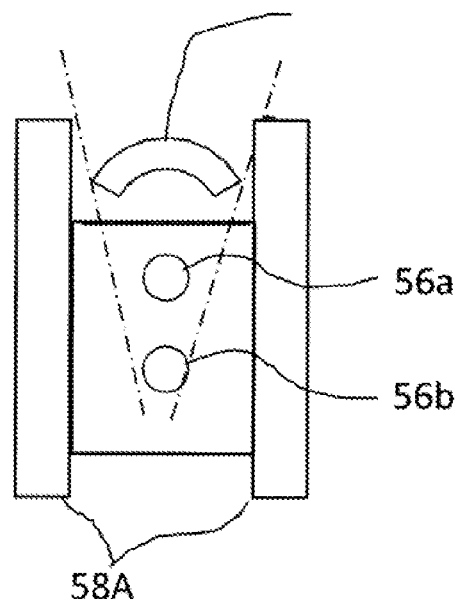
FIG. 5A is a front view showing a modification of a poured water blocking wall in FIG. 3.
Figure 5B:
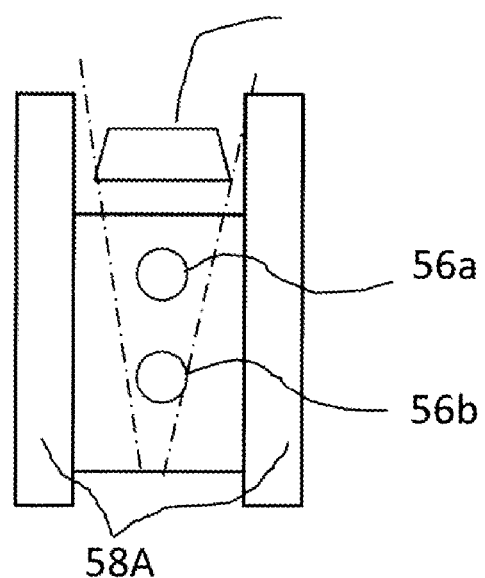
FIG. 5B is a front view showing a modification of the poured water blocking wall in FIG. 3.
Figure 5C:
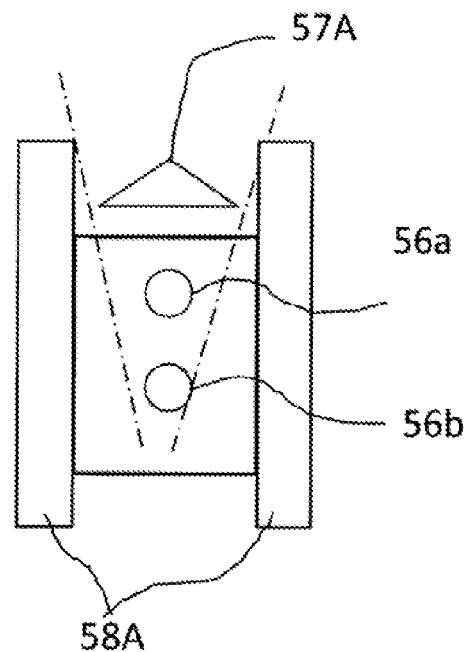
FIG. 5C is a front view showing a modification of the poured water blocking wall in FIG. 3.
Figure 5D:
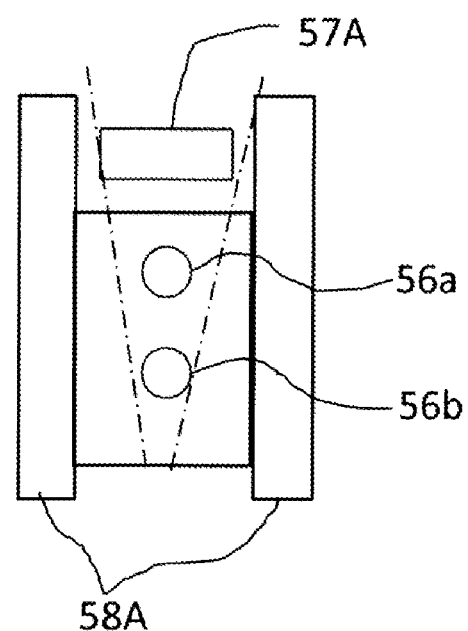
FIG. 5D is a front view showing a modification of the poured water blocking wall in FIG. 3.
Figure 6:
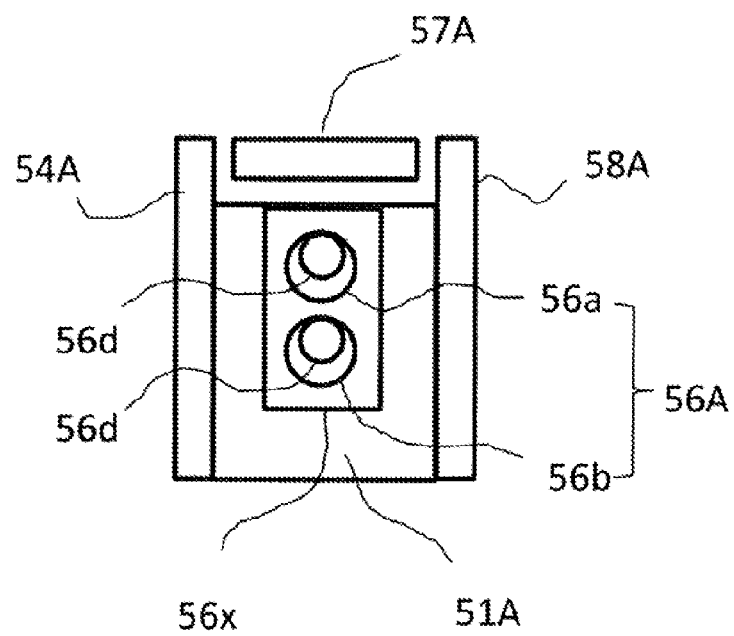
FIG. 6 is a front view of an atmospheric opening in FIG. 4.

(1) Detailed Description of Configuration FIG. 1 is an external view of a waterproof type control apparatus according to Embodiment 1, FIG. 2 is a cross-sectional view of a connector connection portion in FIG. 1, FIG. 3 is a cross-sectional view taken along a Z-Z line in FIG. 2, FIG. 4 is a detailed cross-sectional view of a connector housing in FIG. 1, FIGS. 5A to 5D are front views showing modifications of a poured water blocking wall in FIG. 3, and FIG. 6 is a front view of an atmospheric opening in FIG. 4. Hereinafter, the configurations of these drawings will be sequentially described in detail.

In FIG. 1, a casing 11A includes: a base 20A that has mounting legs at four sides thereof and is made of an aluminum die casting or a sheet metal; and a cover 30A that is made of a resin or a sheet metal, a circuit board 40 on which a connector housing 50A described later with reference to FIG. 4 is mounted is sealed and housed in the casing 11A, and an outer portion from a partition wall 51A of the connector housing 50A, water barrier walls 58A described later, and a poured water blocking wall 57A described later are exposed from the casing 11A.

A mating connector 12A is inserted to the exposed part of the connector housing 50A so as to establish a connection with an external apparatus via a wire harness 60A.

In FIG. 2, the connector housing 50A, which is made of the resin, includes an inner annular peripheral wall 53A and an outer annular peripheral wall 54A that are provided laterally to a partition wall 51A, and is configured such that the mating connector 12A is attached to the outer annular peripheral wall 54A that is at the side of exposure from the casing 11A.

Three sides of the outer periphery of the inner annular peripheral wall 53A are in contact with an opening surface of the cover 30A in FIG. 1 via a waterproof sealing material that is not shown, the remaining one side of the outer periphery is in contact with one side of the base 20A via the waterproof sealing material that is not shown, and an annular projection 53c for preventing outflow of the waterproof sealing material is provided at a position where the interior and the exterior are separated by the partition wall 51A.

A plurality of first connection terminals 52A are press-fitted and fixed to the partition wall 51A, and each are configured such that one end thereof is orthogonally converted and soldered to the circuit board 40 described later with reference to FIG. 4, and the other end thereof is brought into electrically conductive contact with a second connection terminal 14 provided in the mating connector 12A.

The partition wall 51A is provided with a fine hole 59 that provides communication between the inner space of the casing 11A and a sealed space at the connector side. The mating connector 12A has an annular space defined by: an inner body portion 12x into which a plurality of second connection terminals 14 are inserted; and an outer peripheral wall 12y surrounding the inner body portion 12x, and is configured such that the outer annular peripheral wall 54A of the connector housing 50A is inserted into the annular space.

A waterproofing mechanism that is not shown is provided at a position where the mating connector 12A and the wire harness 60A in FIG. 1 are received, and waterproofness between the mating connector 12A and the connector housing 50A is provided by a waterproof packing 15 that is disposed on the inner peripheral surface of the outer annular peripheral wall 54A and the outer periphery of the inner body portion 12x.

In FIG. 3, the plurality of second connection terminals 14 described above with reference to FIG. 2 are inserted into the inner body portion 12x of the mating connector 12A, and the first connection terminals 52A are further inserted into the second connection terminals 14.

Although the outer peripheral wall 12y of the mating connector 12A is present on the outer periphery of the outer annular peripheral wall 54A, the position of the cross-section taken along the Z-Z line is a position where the outer peripheral wall 12y is not present.

In an outer wall surface of the partition wall 51A of the connector housing 50A, a breath ventilation hole 56A including first and second ventilation holes 56a and 56b described later with reference to FIG. 4 is opened and exposed, and the water barrier walls 58A at three sides are provided so as to surround the opening of the breath ventilation hole 56A. However, in the present embodiment, the outer annular peripheral wall 54A serves as one of the water barrier walls 58A at the three sides serves. Therefore, the water barrier wall 58A standing upright on the partition wall 51A, the water barrier wall 58A (see FIGS. 1 and 4) parallel to the partition wall 51A, and the outer annular peripheral wall 54A surround the three sides.

An eave portion that is the poured water blocking wall 57A is provided at the upper surface of a rectangular tube-shaped portion having three sides formed by the outer wall surface of the partition wall 51A, the water barrier wall 58A, and a part of the outer annular peripheral wall 54A. The poured water blocking wall 57A is provided at a position above the breath ventilation hole 56A so as to hinder passing of poured water in a first direction from a cover 30A side plane to a base 20A side plane, to prevent the breath ventilation hole 56A from being wetted with the water.

The first and second ventilation holes 56a and 56b may be arranged in the right-left direction, or either one of the first and second ventilation holes 56a and 56b may be omitted.

The poured water blocking wall 57A in Embodiment 1 is provided above the breath ventilation hole 56A, and the apparatus having this configuration is referred to as "regular product". When the direction of an insert of a mold for manufacturing the connector housing 50A is made opposite, a "mirror-image product" can be produced in which the poured water blocking wall 57A is provided at a position below the breath ventilation hole 56A so as to hinder passing of poured water in a second direction from the base 20A side plane to the cover 30A side plane.

In FIG. 4, the connector housing 50A is fixed to one side of the circuit board 40, and the plurality of right-angle-type first connection terminals 52A are soldered thereto.

A water-repellent filter 55A is bonded and fixed to an inner wall of the partition wall 51A of the connector housing 50A to which the plurality of first connection terminals 52A are press-fitted and fixed, and is a flat porous material that has an inner surface portion 55a and an outer surface portion 55b and has, for example, a circular shape, a square shape, or an elliptical shape.

The inner surface portion 55a of the water-repellent filter 55A is fully opened to the inner space of the casing 11A, and the outer surface portion 55b is fully opened to the breath ventilation hole 56A, which is provided in the partition wall 51A and includes the first and second ventilation holes 56a and 56b, except for a contour outer peripheral portion of the outer surface portion 55b.

The opening ends of the first and second ventilation holes 56a and 56b are provided in a plateau plane portion 56x that projects from the outer wall surface of the partition wall 51A, and are also surrounded by the water barrier walls 58A at the three sides, and the poured water blocking wall 57A is provided at a position above or below the opening ends.

FIGS. 5A to 5D are front views showing modifications of the poured water blocking wall 57A which is the eave portion, and the cross-sectional shape is a U shape in FIG. 5A, a trapezoidal shape in FIG. 5B, a triangular shape in FIG. 5C, and a flat plate shape in FIG. 5D. In any of these cases, the poured water blocking wall 57A is disposed adjacently to the water barrier wall 58A or the outer annular peripheral wall 54A at a small gap therewith. However, as indicated by alternate long and short dash lines in each drawing, when water is poured from above the poured water blocking wall 57A, the first and second ventilation holes 56a and 56b are not wetted directly with the water. Therefore, even when the small gap is provided, the same water blocking effect is obtained as in the case where the gap is not provided and the poured water blocking wall 57A is in close contact with the water barrier wall 58A or the outer annular peripheral wall 54A. When the small gap is provided, water can be prevented from being accumulated in a recess closed by the water barrier wall 58A and the poured water blocking wall 57A or by the outer annular peripheral wall 54A and the poured water blocking wall 57A with a mounting angle shown in a diagram 110, 160, or 170 in FIG. 7 described later.

FIG. 6 is a front view of an atmospheric opening of the breath ventilation hole 56A. The breath ventilation hole 56A, which includes the first and second ventilation holes 56a and 56b, is exposed and opened in the outer wall surface of the partition wall 51A, and communicates with the outer surface portion 55b of the water-repellent filter 55A via inner throttling hole portions 56d, and the opening surface of the breath ventilation hole 56A is provided in the plateau plane portion 56x that is higher than the surrounding portion.

In FIG. 6, the water barrier wall 58A and a side surface portion of the outer annular peripheral wall 54A surrounds the opening of the breath ventilation hole 56A, but the water barrier wall 58A that has a surface opposing and parallel to the partition wall 51A, shown in FIG. 4, is not shown.

Due to such a structure, when a ventilation test is conducted, the structure of a jig for opening or closing the breath ventilation hole 56A is simplified, and air-tight closing can be easily performed if an elastic body such as a rubber material is attached to a jig face.

Even when a small amount of water flows on the partition wall 51A that is in a horizontal state, the water does not flow into the breath ventilation hole 56A since the opening of the breath ventilation hole 56A is provided in the plateau plane portion 56x.

(2) Detailed Description of Effects and Operation

Next, effects and operation of the waterproof type control apparatus 10A of Embodiment 1 will be described.

In FIGS. 1 and 4, a heating component that is not shown is mounted on the circuit board 40 that is sealed and housed in the casing 11A. When an air pressure difference occurs based on the temperature difference between the interior and the exterior of the casing, the air within the casing 11A is breathed via the water-repellent filter 55A and the breath ventilation hole 56A, so that deformation of the casing 11A is prevented, or occurrence of crack and separation of the waterproof sealing material between the base 20A and the cover 30A or the waterproof sealing material between the connector housing 50A and the base 20A or the cover 30A, is prevented.

In a connector space that is sealed by the connector housing 50A and the mating connector 12A and includes the portion where each first connection terminal 52A and each second connection terminal 14 are in electrically conductive contact with each other, breathing is performed via the fine hole 59 (see FIG. 2) and the inner space of the casing 11A.

Figure 7:
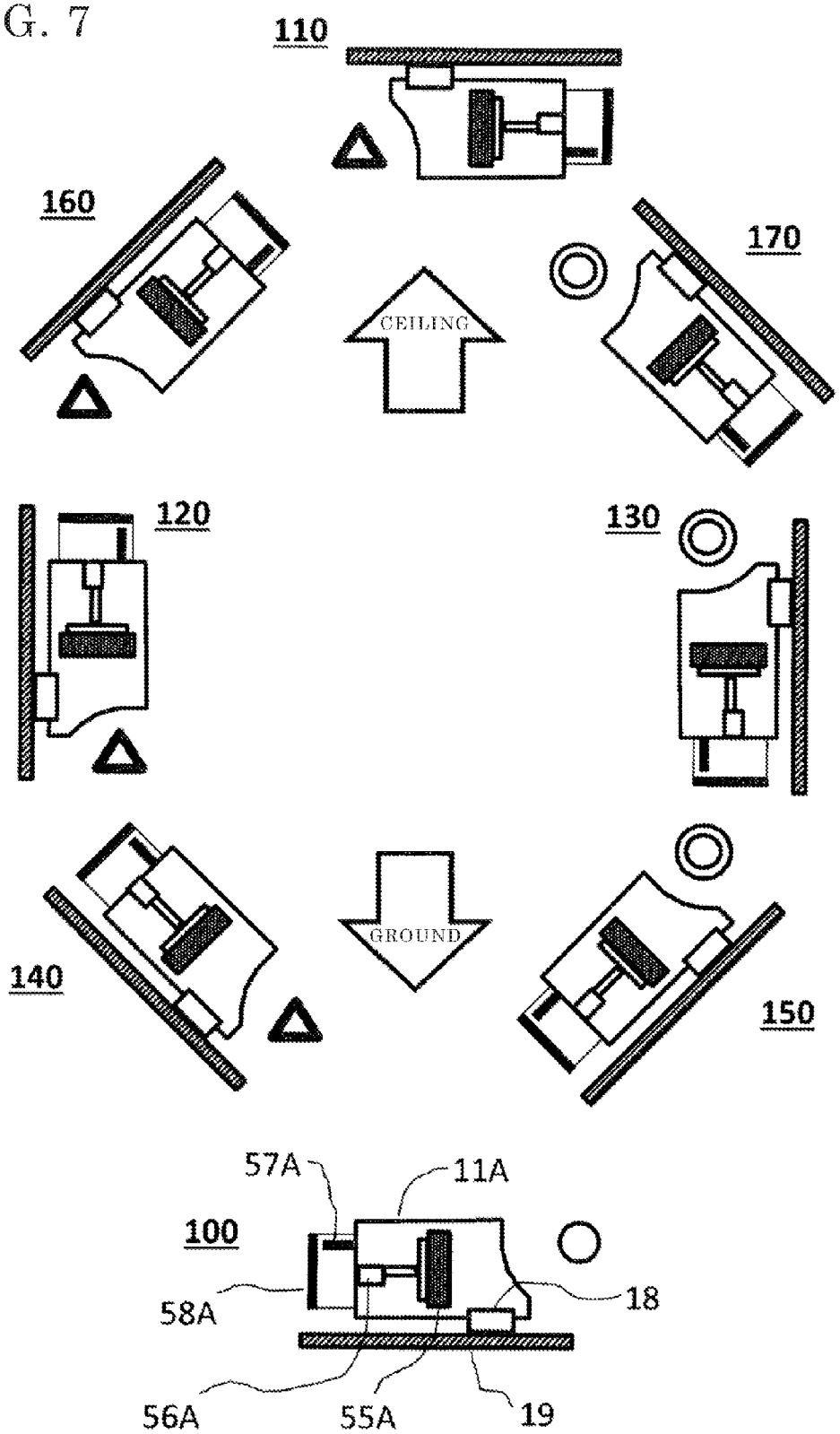
FIG. 7 is an explanatory diagram showing positions of an opening of a breath ventilation hole with respect to various mounting angles for the waterproof type control apparatus ("regular product") in FIG. 1.
Figure 8:
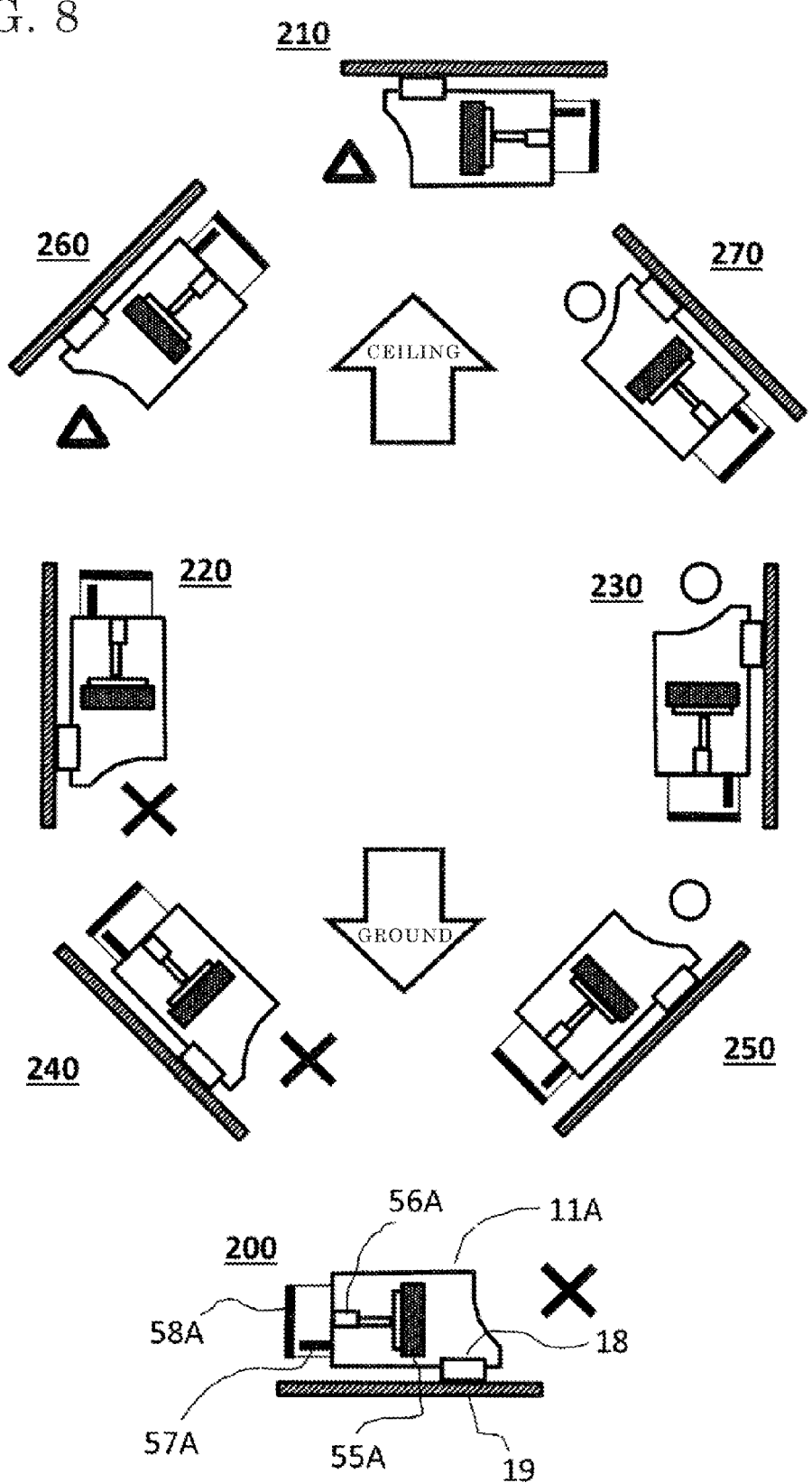
FIG. 8 is an explanatory diagram showing positions of an opening of a breath ventilation hole with respect to various mounting angles regarding a "mirror-image product" for the waterproof type control apparatus ("regular product") in FIG. 1.

FIG. 7 is an explanatory diagram showing positions of the opening of the breath ventilation hole 56A with respect to various mounting angles regarding the "regular product" shown in FIG. 1. FIG. 8 is an explanatory diagram showing positions of the opening of the breath ventilation hole 56A with respect to various mounting angles regarding the "mirror-image product" for the "regular product" in FIG. 1. With reference to these drawings, the mounting direction of the waterproof type control apparatus 10A and whether the water-repellent filter 55A is wetted with water will be described in detail.

"◉", "○", "x", "Δ" shown in FIGS. 7 and 8 simply indicate appropriateness of a mounting manner.

In FIG. 7, a diagram 100 schematically shows a case where the "regular product" is mounted on a floor surface such as the upper surface of a shelf board, the casing 11A is fixed to a mounted surface 19 that is a horizontal floor surface, via a mounting leg 18 of the casing 11A, the water barrier walls 58A at the three sides and the poured water blocking wall 57A that hinders poured water from entering the inside of the water barrier walls 58A are provided at the opening of the breath ventilation hole 56A, which communicates with the water-repellent filter 55A included in the casing 11A via the throttling hole portion 56d, and the poured water blocking wall 57A is located at a position opposite to the mounted surface 19 as shown in the drawing.

Therefore, water poured from above in a direction to the floor surface by high-pressure washing or the like is not poured directly over the opening of the breath ventilation hole 56A, and the poured water flowing on the opening surface also does not flow into the breath ventilation hole 56A for the following reasons. Therefore, the water-repellent filter 55A is not wetted by water.

(1) As the first reason, even when water enters the breath ventilation hole 56A, since the throttling hole portion 56d is located at an upper stage, the water does not enter the water-repellent filter 55A if the amount of the water is small.

(2) As the second reason, when the plateau plane portion 56x shown in FIG. 6 is provided for the opening of the breath ventilation hole 56A, water flowing down on the outer wall surface of the partition wall 51A does not flow into the breath ventilation hole 56A.

In FIG. 7, a diagram 110 schematically shows a case where the "regular product" is mounted on a ceiling surface such as the lower surface of a shelf board. There is a possibility that poured water that is splashed back to the ceiling surface flows into the opening of the breath ventilation hole 56A and reaches the water-repellent filter 55A, but this is avoided for the above-described second reason.

However, in the case shown in FIG. 11 of Embodiment 2 described later, water is accumulated by water barrier walls 58B at three sides and a poured water blocking wall 57B, and poured water flows into the water-repellent filter 55B some time later. Thus, this mounting direction is inappropriate.

In FIG. 7, a diagram 120 schematically shows a case where the "regular product" is mounted on a vertical wall surface. Since the water barrier wall 58A is located at the upper side, when water poured over the wall surface flows into the opening of the breath ventilation hole 56A, the water-repellent filter 55A is wetted with the water. However, for the above-described second reason, water flowing on the outer surface of the partition wall 51A is blocked by the plateau plane portion 56x to make it difficult for the water to flow into the breath ventilation hole 56A. In FIG. 7, a diagram 130 schematically shows a case where the "regular product" is mounted on a vertical wall surface. Water poured over the wall surface does not flow into the opening of the breath ventilation hole 56A.

In addition, in this case, the water barrier wall 58A is located at the lower side, and the breath ventilation hole 56A becomes an upward hole. Thus, the water-repellent filter 55A is not wetted with water.

In FIG. 7, a diagram 140 schematically shows a case where the "regular product" is mounted on an inclined floor surface with the water barrier wall 58A located at the upper side. Water poured over the inclined floor surface does not reach the opening of the breath ventilation hole 56A having a certain fall, and the water-repellent filter 55A is not wetted with water.

However, if the amount of poured water from the poured water blocking wall 57A is large and the poured water flows over the plateau plane portion 56x into the breath ventilation hole 56A, the water-repellent filter 55A is wetted with the water, and there is also a problem that the water cannot be discharged, since the breath ventilation hole 56A is a downward hole.

In FIG. 7, a diagram 150 schematically shows a case where the "regular product" is mounted on an inclined floor surface with the water barrier wall 58A located at the lower side. Water poured over the inclined floor surface does not reach the opening of the breath ventilation hole 56A having a certain fall, and the water-repellent filter 55A is not wetted with water, since the breath ventilation hole 56A becomes an upward hole.

In FIG. 7, a diagram 160 schematically shows a case where the "regular product" is mounted on an inclined ceiling surface with the water barrier wall 58A located at the upper side. For the above-described second reason, water poured over the inclined ceiling surface does not flow into the breath ventilation hole 56A, and water is not accumulated at the water barrier walls 58A at the three sides. Thus, the poured water does not flow into the water-repellent filter 55A.

However, if the amount of poured water from the poured water blocking wall 57A is large and the poured water flows over the plateau plane portion 56x into the breath ventilation hole 56A, the water-repellent filter 55A is wetted with the water, and there is also a problem that the water cannot be discharged, since the breath ventilation hole 56A is a downward hole.

In Embodiment 2 described later, in the case shown in FIG. 11, water is accumulated similarly as shown in the diagram 110 in FIG. 7, and thus this mounting direction is inappropriate.

In FIG. 7, diagram 170 schematically shows a case where the "regular product" is mounted on an inclined ceiling surface with the water barrier wall 58A located at the lower side. Water poured over the inclined ceiling surface flows past the opening of the breath ventilation hole 56A, but the water-repellent filter 55A is not wetted with the water, since the breath ventilation hole 56A becomes an upward hole. In addition, poured water flowing into the inside of the water barrier walls 58A at the three sides flows out to the outside through the small gap provided around the poured water blocking wall 57A.

In Embodiment 2 described later, in the case shown in FIG. 11, water is accumulated similarly as shown in the diagram 110 in FIG. 7, and thus this mounting direction is inappropriate.

In FIG. 8, a diagram 200 schematically shows a case where the "mirror-image product" in which the direction of the poured water blocking wall 57A is made opposite to that in the "regular product" is mounted on a floor surface, the casing 11A is fixed to the mounted surface 19 that is a horizontal floor surface such as the upper surface of a shelf board, via the mounting leg 18 of the casing 11A, the water barrier walls 58A at the three sides and the poured water blocking wall 57A that hinders poured water from entering the inside of the water barrier walls 58A are provided at the opening of the breath ventilation hole 56A, which communicates with the water-repellent filter 55A included in the casing 11A via the throttling hole portion 57d, and the poured water blocking wall 57A is disposed at a position opposing the mounted surface 19.

Therefore, water poured in the direction to the floor surface by high-pressure washing or the like is poured directly over the opening of the breath ventilation hole 56A, and enters the water-repellent filter 55A if the breath ventilation hole 56A is inclined even slightly. Thus, this mounted position is inappropriate.

In Embodiment 2 described later, in the case shown in FIG. 11, water is accumulated by the water barrier walls 58B at the three sides and the poured water blocking wall 57B, and poured water flows into the water-repellent filter 55B some time later. Thus, this mounting direction is most inappropriate.

In FIG. 8, a diagram 210 schematically shows a case where the "mirror-image product" is mounted on a ceiling surface such as the lower surface of a shelf board. Poured water that is splashed back to the ceiling surface is poured over the opening of the breath ventilation hole 56A, but, for the first reason described with reference to the diagram 100 in FIG. 7, the water is not poured to the breath ventilation hole 56A or the water-repellent filter 55A.

In the case of mounting on the ceiling surface, it is conceivable that high-pressure washing water from the above is blocked by the shelf board itself and wetting directly with water splashed back from a road surface is prevented by an obstacle such as an engine, and wetting directly with high-pressure washing water from the lower side to the upper side is not expected.

In FIG. 8, a diagram 220 schematically shows a case where the "mirror-image product" is mounted on a vertical wall surface. Since the water barrier wall 58A is located at the upper side, the breath ventilation hole 56A becomes a downward hole. Thus, when water poured directly by high-pressure washing flows into the opening of the breath ventilation hole 56A, the water-repellent filter 55A is wetted with the water.

In FIG. 8, a diagram 230 schematically shows a case where the "mirror-image product" is mounted on a vertical wall surface. In this case, since the water barrier wall 58A is located at the lower side and the breath ventilation hole 56A becomes an upward hole, even when water is poured over the opening of the breath ventilation hole 56A, the water-repellent filter 55A is unlikely to be wetted with the water.

In FIG. 8, a diagram 240 schematically shows a case where the "mirror-image product" is mounted on an inclined floor surface with the water barrier wall 58A located at the upper side. Water poured over the opening of the breath ventilation hole 56A by high-pressure washing or the like flows into the breath ventilation hole 56A that becomes a downward hole, and the water-repellent filter 55A is wetted with the water. Thus, this mounted position is inappropriate.

In Embodiment 2 described later, in the case shown in FIG. 11, water is accumulated similarly as shown in the diagram 200 in FIG. 8, and thus this mounting direction is more inappropriate.

In FIG. 8, a diagram 250 schematically shows a case where the "mirror-image product" is mounted on an inclined floor surface with the water barrier wall 58A located at the lower side. Even when water is poured over the opening of the breath ventilation hole 56A by high-pressure washing or the like, since the breath ventilation hole 56A becomes an upward hole, the water-repellent filter 55A is located at such a position that the water-repellent filter 55A is unlikely to be wetted with water.

However, in Embodiment 2 described later, in the case shown in FIG. 11, water is accumulated similarly as shown in the diagram 200 in FIG. 8, and thus this mounting direction is inappropriate.

In FIG. 8, a diagram 260 schematically shows a case where the "mirror-image product" is mounted on an inclined ceiling surface with the water barrier wall 58A located at the upper side. In this mounting direction, for the above-described second reason, water poured over the inclined ceiling surface does not flow into the breath ventilation hole 56A, and the breath ventilation hole 56A is unlikely to be wetted directly with water poured by high-pressure washing. Thus, the poured water does not flow into the water-repellent filter 55A.

In FIG. 8, a diagram 270 schematically shows a case where the "mirror-image product" is mounted on an inclined ceiling surface with the water barrier wall 58A located at the lower side. Since the breath ventilation hole 56A becomes an upward hole, water poured over the opening of the breath ventilation hole 56A does not flow into the water-repellent filter 55A. In the cases of the diagrams 260 and 270 in FIG. 8, similarly to the case of the diagram 210, it is conceivable that wetting directly with water poured by high-pressure washing is prevented by the shelf board itself or some sort of an obstacle.

When FIG. 7 and FIG. 8 are compared to each other, if either the "regular product" or the "mirror-image product" is selected for each of the various mounting directions of the waterproof type control apparatus 10A, the water-repellent filter 55A can be prevented from being wetted with water.

In the wall surface-mounted manners in the cases of the diagrams 120 and 130 in FIG. 7 and in the cases of the diagrams 220 and 230 in FIG. 8, the connector housing 50A is located at the upper ceiling surface side or the lower floor surface side of the casing 11A. If the connector housing 50A is located in a horizontal direction, since the breath ventilation hole 56A extends horizontally, when poured water flows into the breath ventilation hole 56A, the water-repellent filter 55A is wetted with the water.

However, if the outlet of the breath ventilation hole 56A is made to have a large diameter and the throttling hole portion 57d having a small diameter is provided at an upper eccentric position on the breath ventilation hole 56A, a small amount of water does not flow into the throttling hole portion 57d, and therefore the water-repellent filter 55A is not wetted with water.

(3) Main Points and Features of Embodiment 1

As is obvious from the above description, the waterproof type control apparatus 10A according to Embodiment 1 of the present invention includes: the circuit board 40 that is sealed and housed in the casing 11A that includes the base 20A having the mounting surface and the cover 30A; the connector housing 50A that is a resin molded member that is mounted at the one side of the circuit board 40 and exposed from a side surface opening of the cover 30A; and the plurality of first connection terminals 52A that are press-fitted into the partition wall 51A of the connector housing 50A. The one end of each first connection terminal 52A is connected to a circuit pattern of the circuit board 40, and the other end of each first connection terminal 52A is connected in a contact conductive manner to the second connection terminal 14 provided within the mating connector 12A, so that the waterproof type control apparatus 10A is connected to the wire harness 60A that is outside the casing 11A. The connector housing 50A includes the outer annular peripheral wall 54A that is provided at the outer side of the partition wall 51A and to which the mating connector 12A is fitted, and the waterproof packing 15 for preventing water from entering the closed space including a contact conductive portion between each first connection terminal 52A and each second connection terminal 14 is provided between an end surface portion of the outer annular peripheral wall 54A and the mating connector 12A.

The water-repellent filter 55A is fixed in a close contact manner to the inner wall of the partition wall 51A, and is a flat porous material that includes a plurality of fine pores that block entry and passing of water droplets into the casing 11A and allow the atmospheric air to freely pass therethrough. The water-repellent filter 55A includes: the inner surface portion 55a that communicates with the inner space of the casing 11A; and the outer surface portion 55b that communicates with the breath ventilation hole 56A through which the outside air is introduced. At the breath ventilation hole 56A, the water barrier walls 58A are disposed at three sides of an atmospheric opening surface penetrating the partition wall 51A, and the poured water blocking wall 57A is disposed which partially blocks either one of poured water in the first direction flowing from the cover 30A side plane to the base 20A side plane or poured water in the second direction flowing from the base 20A side plane to the cover 30A side plane and releases the other poured water. The regular product in which the poured water blocking wall 57A partially blocks the poured water in the first direction or the mirror-image product in which the poured water blocking wall 57A partially blocks the poured water in the second direction is used depending on whether the base 20A is mounted on a floor surface or a ceiling surface.

As described above, the waterproof type control apparatus according to the present invention includes the circuit board 40 housed in the sealed casing 11A and the connector housing 50A exposed from one side of the sealed casing 11A, the first connection terminals 52A each having one end connected to the circuit board 40 and another end that is brought into electrically conductive contact with the second connection terminal 14 within the mating connector 12A are press-fitted and fixed to the partition wall 51A of the connector housing 50A, and the water-repellent filter 55A, which is the flat porous material, is fixed in a close contact manner to the partition wall 51A of the connector housing 50A. The poured water blocking wall 57A and the water barrier walls 58A at the three sides are provided at the breath ventilation hole 56A orthogonal to the partition wall 51A, and the outer surface portion of the water-repellent filter 55A is opened to the atmosphere. This relates to claim 1.

Therefore, since the water-repellent filter 55A is mounted on the inner surface of the connector housing 50A, a functional test can be conducted on the apparatus alone, and also there is an effect that the area of the water-repellent filter 55A can be increased to reduce the air pressure difference between the interior and the exterior, as compared to the case where the water-repellent filter 55A is provided within the mating connector 12A.

In addition, the mounting structure becomes simpler and cheaper than one in which the water-repellent filter 55A is provided to a specially provided intermediate wall of a cover, so that there is an effect that a cover made of a resin or a sheet metal can be used.

In addition, the position and the direction of the poured water blocking wall 57A can be selected by changing an insertion position of an insert relative to a mold dedicated for the regular product or the mirror-image product or a shared mold, the breath ventilation hole 56A can be formed by the molded structure of the connector housing 50A, and the mounting environment can be handled by using the water-repellent filter 55A having a simple configuration such that wetting directly by water from the atmospheric opening surface is avoided. Thus, there is an effect that in either case, the common base and cover can be used.

Furthermore, the breath ventilation hole 56A and the water barrier wall 58A are located such that either of the breath ventilation hole 56A or the water barrier wall 58A becomes an upward hole or a upward surface, so that there is an effect that the water-repellent filter 55A can be avoided from being wetted directly with water. In addition, the breath ventilation hole 56A and the structure of the poured water blocking wall 57A and the water barrier wall 58A do not depend on the structure of the mating connector 12A. Thus, the mating connector can be used in common for the connector housing 50A in which the water-repellent filter 55A is mounted and a conventional-type connector housing in which a water-repellent filter is not mounted, so that there is an economical effect that it is not necessary to additionally produce a new mold.

In the waterproof type control apparatus 10A according to Embodiment 1 of the present invention, further, the poured water blocking wall 57A is an eave portion that is provided on the partition wall 51A so as to project therefrom and be spaced apart from the water barrier walls 58A at the three sides at a small gap for partial blocking, and of which a cross-sectional shape is a U shape, a trapezoidal shape, a triangular roof shape, or a flat plate shape. In the case with any of the shapes, the poured water blocking wall 57A is provided at the side at which water poured toward the atmospheric opening end of the breath ventilation hole 56A is blocked.

As described above, in connection with claim 2 of the present invention, the cross-sectional shape of the eave portion, which is the poured water blocking wall 57A, is a U shape, a trapezoidal shape, a triangular roof shape, or a flat plate shape.

Therefore, even with any of the cross-sectional shapes, the poured water blocking wall 57A can be formed by a combination of an upper mold and a lower mold as a forming mold. In the case where the cross-sectional shape is a trapezoidal shape, a triangular roof shape, or a flat plate shape, the forming mold may be one divided in the right-left direction or the front-back direction.

In addition, when the poured water blocking wall 57A is located at the lower side, flowing water can be discharged through the small gap between the poured water blocking wall 57A and the water barrier walls 58A at the three sides.

In the waterproof type control apparatus 10A according to Embodiment 1 of the present invention, further, the outer annular peripheral wall is the single outer annular peripheral wall 54A, the mating connector is also the single mating connector 12A, and the water barrier wall 58A is provided at a position at a side surface of the outer annular peripheral wall 54A, and is provided at a position away from an outer wall surface of the outer annular peripheral wall 54A, or is provided at a position that is at a depth portion of the inserted mating connector 12A and is away from an opening end of the outer annular peripheral wall 54A, such that insertion of the mating connector 12A is not hindered.

As described above, in connection with claim 3 of the present invention, the poured water blocking wall 57A and the water barrier walls 58A at the three sides are restricted to a position where insertion of the mating connector is not hindered.

Therefore, there is a feature that the water barrier walls can be provided adjacently to the vicinity of the connector provided at an advantageous location where consideration is given such that wetting directly with water is avoided.

In addition, when the water barrier walls 58A at the three sides are provided at a position away from the opening end of the outer annular peripheral wall 54A such that insertion of the mating connector 12A is not hindered, the side surface portion of the outer annular peripheral wall 54A can be used as one of the water barrier walls.

In the waterproof type control apparatus 10A according to Embodiment 1 of the present invention, further, the plurality of first connection terminals 52A are arranged at a plurality of stages in a direction orthogonal to the board surface of the circuit board 40, the breath ventilation hole 56A includes the first ventilation hole 56a and the second ventilation hole 56b that are arranged in a vertical direction orthogonal to the board surface of the circuit board 40 or in a horizontal direction parallel to the board surface, ends of the first and second ventilation holes 56a and 56b communicate with the outer surface portion 55b of the water-repellent filter 55A, the other ends of the first and second ventilation holes 56a and 56b are opened to the atmosphere, and the poured water blocking wall 57A is shared by the first and second ventilation holes 56a and 56b.

As described above, in connection with claim 4 of the present invention, the first and second ventilation holes 56a and 56b that communicate with the outer surface portion 55b of the water-repellent filter 55A are provided so as to be arranged in the vertical direction or the horizontal direction, and the first and second ventilation holes 56a and 56b are configured to share the one poured water blocking wall 57A such that the atmospheric opening is avoided from being wetted directly with water. Therefore, even when clogging of one ventilation hole occurs, ventilation can be performed by the other ventilation hole, so that the reliability improves. The same also applies to Embodiment 2.

In the waterproof type control apparatus 10A according to Embodiment 1 of the present invention, further, the throttling hole portion 56d is provided such that the hole diameter of the breath ventilation hole 56A is small at the position of a depth portion thereof that communicates with the outer surface portion 55b of the water-repellent filter 55A. This relates to claim 5 of the present invention.

Therefore, in the case where the mounting surface for the waterproof type control apparatus 10A is slightly inclined and the breath ventilation hole 56A is slightly inclined from a horizontal position such that the water-repellent filter 55A side is located at a lower position, a portion for accumulating poured water having flowed in is generated, so that the poured water can be prevented from flowing into the water-repellent filter 55A. Water accumulated within the breath ventilation hole 56A is dried and evaporated some time later.

In the case where the mounting surface for the waterproof type control apparatus 10A is greatly inclined so that the opening of the breath ventilation hole 56A is wetted directly with water, by using one in which the position and the direction of the poured water blocking wall 57A are changed, wetting directly with water is avoided, and by the breath ventilation hole 56A becoming an upward hole, water is prevented from flowing into the water-repellent filter 55A.

In the waterproof type control apparatus 10A according to Embodiment 1 of the present invention, further, the throttling hole portion 56d is located eccentrically from the central position of the breath ventilation hole 56A, and the throttling hole portion 56d is located eccentrically in such a direction that the portion for accumulating poured water is widened, by changing the shape of an insert mold for forming the throttling hole portion 56d in response to a predetermined mounting inclination angle.

As described above, in connection with claim 6 of the present invention, at the central position of the throttling hole portion 56d provided at the depth portion of the breath ventilation hole 56A, the amount of poured water accumulated in the breath ventilation hole 56A can be easily increased when an insert mold corresponding to a mounting inclination angle of the base 20A is used.

The same also applies to Embodiment 2.

In the waterproof type control apparatus 10A according to Embodiment 1 of the present invention, further, the fine hole 59 is provided in the partition wall 51A so as to communicate with the inner space of the casing 11A. Therefore, breathing between the interior of the casing 11A and the outside air caused by the temperature difference between the interior and the exterior of the casing 11A can be performed (1) freely via the water repellent filter 55A, not via a small space in the connector portion connected to the mating connector 12A, and (2) via the fine hole 59 between the inner space of the casing 11A and the closed space of the connector portion to which the mating connector 12A is connected.

When the mating connector 12A is inserted or pulled out, occurrence of insertion/pulling-out resistance caused by air resistance can be suppressed. In addition, in a single product state where the mating connector 12A is not attached, dust can be prevented from freely entering through the opening surface of the connector.

The same also applies to Embodiment 2.

In the waterproof type control apparatus 10A according to Embodiment 1 of the present invention, further, the opening end of the breath ventilation hole 56A is provided in the plateau plane portion 56x which projects from the outer wall surface of the partition wall 51A. This relates to claim 8 of the present invention.

Accordingly, even when a small amount of water flows on the partition wall 51A that is in a horizontal state, since the opening end of the breath ventilation hole 56A is provided in the plateau plane portion 56x, the water does not flow into the breath ventilation hole 56A. In addition, when a ventilation test is conducted on the water-repellent filter 55A, if an elastic body is provided on a contact face of a jig for closing or opening the opening end of the breath ventilation hole 56A, air-tight closing can be easily performed.

Embodiment 2

(1) Detailed Description of Configuration and Effects/Operation

Figure 9:
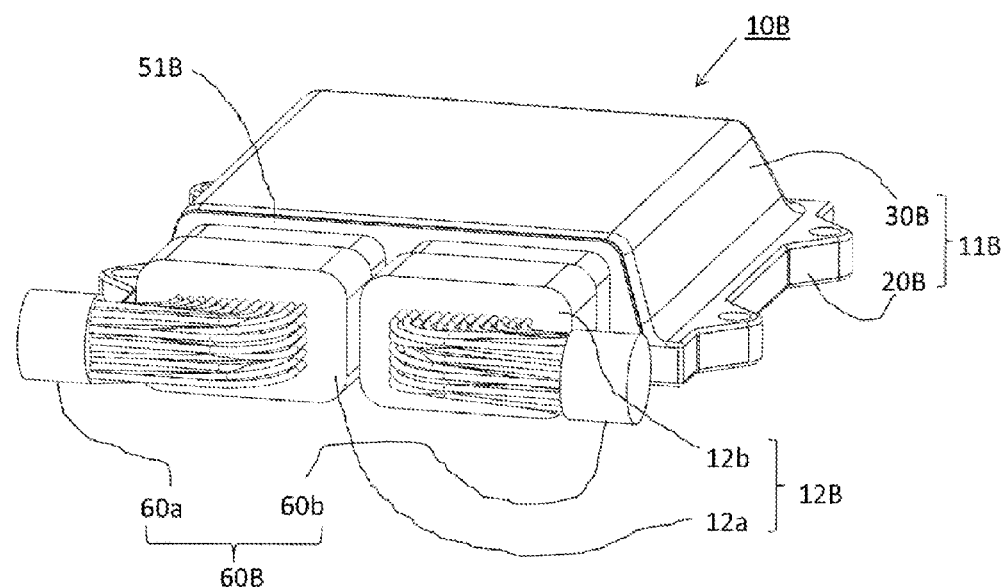
FIG. 9 is an external view of a waterproof type control apparatus according to Embodiment 2 of the present invention.
Figure 10:
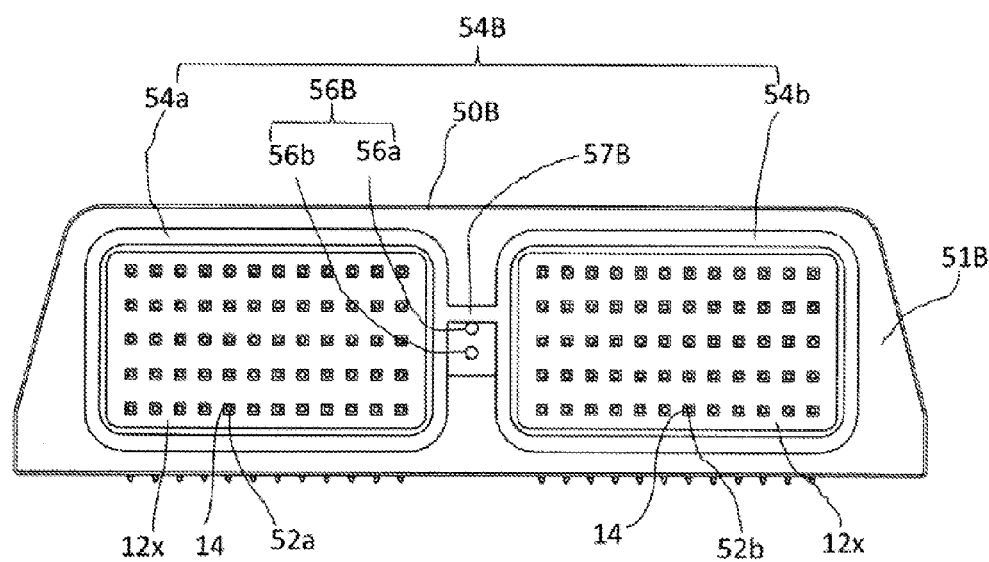
FIG. 10 is a plan view of a connector connection portion shown in FIG. 9.
Figure 11:
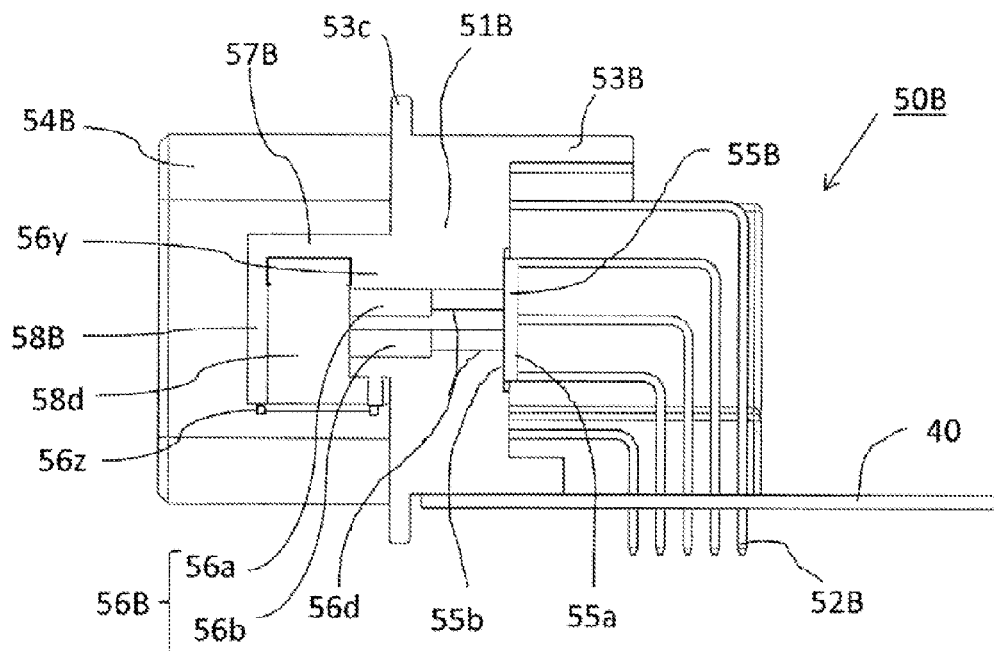
FIG. 11 is a detailed cross-sectional view of a connector housing shown in FIG. 9.
Figure 12A:
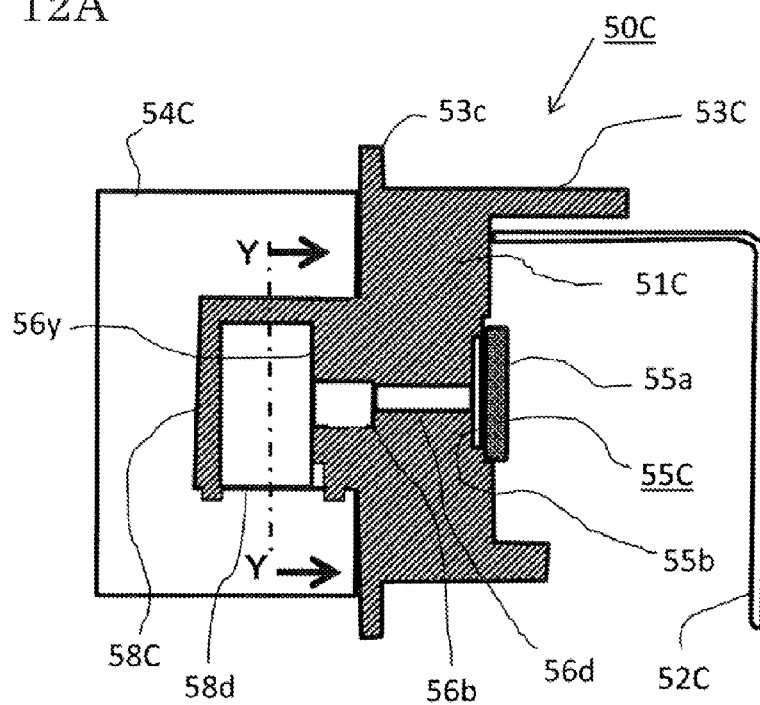
FIG. 12A is a detailed cross-sectional view of a modification of the connector housing in FIG. 11.
Figure 12B:
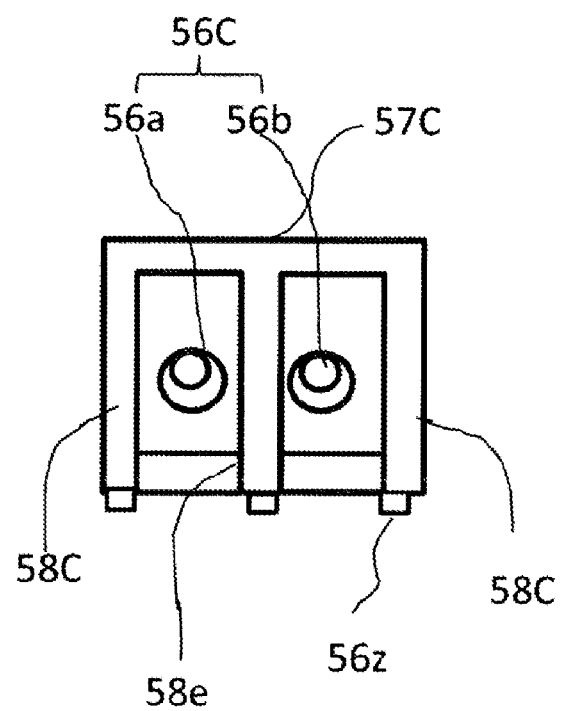
FIG. 12B is a cross-sectional view taken along a Y-Y line in FIG. 12A.

FIG. 9 is an external view of a waterproof type control apparatus according to Embodiment 2 of the present invention, FIG. 10 is a plan view of a connector connection portion in FIG. 9, FIG. 11 is a detailed cross-sectional view of a connector housing in FIG. 9, FIG. 12A is a detailed cross-sectional view of a modification of the connector housing in FIG. 9, and a FIG. 12B is a cross-sectional view taken along a Y-Y line in FIG. 12A.

Hereinafter, the difference from FIGS. 1 to 8 of Embodiment 1 will be mainly described in detail. In each drawing, the same reference numerals denote the same or equivalent portions.

The main difference from Embodiment 1 is that an outer annular peripheral wall 54B or 54C of a connector housing 50B or 50C is divided into first and second annular peripheral walls 54a and 54b and first and second groups of first connection terminals 52a and 52b are pressed-fitted and held by a partition wall 51B or 51C.

In FIG. 9, a casing 11B includes: a base 20B that has mounting legs at four sides thereof and is made of an aluminum die casting or a sheet metal; and a cover 30B that is made of a resin or a sheet metal, a circuit board 40 on which the connector housing 50B described later with reference to FIG. 11 is mounted is sealed and housed in the casing 11B, and parts of the connector housing 50B are exposed from the casing 11B.

A mating connector 12B that is divided and formed by first and second mating connectors 12a and 12b is inserted into the exposed parts of the connector housing 50B so as to establish connections with external apparatuses via a wire harness 60B that includes first and second wire harnesses 60a and 60b, respectively.

The connector housing 50B, which is made of the resin, is configured by replacing the character A shown in FIG. 2 with character B, and includes an inner annular peripheral wall 53B and the outer annular peripheral wall 54B that are provided laterally to the partition wall 51B. The mating connector 12B is attached to the outer annular peripheral wall 54B that is at the side of exposure from the casing 11B. Three sides of the outer periphery of the inner annular peripheral wall 53B are in contact with an opening surface of the cover 30B in FIG. 9 via a waterproof sealing material that is not shown, the remaining one side of the outer periphery is in contact with one side of the base 20B via the waterproof sealing material that is not shown, and an annular projection 53c for preventing outflow of the waterproof sealing material is provided at a position where the interior and the exterior are separated by the partition wall 51B. A plurality of first connection terminals 52B are press-fitted and fixed to the partition wall 51B, and each are configured such that one end thereof is orthogonally converted and soldered to the circuit board 40 described later with reference to FIG. 11, and the other end thereof is brought into electrically conductive contact with a second connection terminal 14 provided in the mating connector 12B.

The partition wall 51B is provided with a fine hole 59 (not shown) that provides communication between the inner space of the casing 11B and a sealed space at the connector side.

Similarly as described above with reference to FIG. 2, the mating connector 12B has annular spaces each defined by an inner body portion 12x into which a plurality of second connection terminals 14 are inserted; and an outer peripheral wall 12y (not shown) surrounding the inner body portion 12x, and is configured such that the outer annular peripheral wall 54B of the connector housing 50B is inserted in each annular space. A waterproofing mechanism that is not shown is provided at a position where the mating connector 12B and the wire harness 60B in FIG. 9 are received, and waterproofness between the mating connector 12B and the connector housing 50B is provided by a waterproof packing (not shown) that is disposed on the inner peripheral surface of the outer annular peripheral wall 54B and the outer periphery of the inner body portion 12x and is the same as the waterproof packing 15 shown in FIG. 2.

In FIG. 10, the plurality of second connection terminals 14 are inserted into the inner body portions 12x of the first and second mating connectors 12a and 12b, and further the first and second groups of first connection terminals 52a and 52b that are first connection terminals 52B are inserted into the second connection terminals 14.

Although the outer peripheral walls 12y of the mating connector 12B are present on the outer peripheries of the first and second annular peripheral walls 54a and 54b that form the outer annular peripheral wall 54B, the position of the cross-section in FIG. 10 is a position where the outer peripheral walls 12y are not present.

A breath ventilation hole 56B including first and second ventilation holes 56a and 56b described later with reference to FIG. 11 are provided in a lower portion of a poured water blocking wall 57B that projects on an outer wall surface of the partition wall 51B of the connector housing 50B. However, either one of the first and second ventilation holes 56a and 56b may be omitted. In addition, the first and second ventilation holes 56a and 56b are arranged in the up-down direction, but may be arranged in the right-left direction.

In FIG. 11, the connector housing 50B is fixed to one side of the circuit board 40, and the plurality of right-angle-type first connection terminals 52B are soldered thereto.

The first connection terminals 52B are divided into the first and second groups of first connection terminals 52a and 52b. A water-repellent filter 55B is bonded and fixed to an inner wall of the partition wall 51B of the connector housing 50B to which the plurality of first connection terminals 52B are press-fitted and fixed, and is a flat porous material that has an inner surface portion 55a and an outer surface portion 55b and has, for example, a circular shape, a square shape, or an elliptical shape.

The inner surface portion 55a of the water-repellent filter 55B is fully opened to the inner space of the casing 11B, and the outer surface portion 55b is fully opened to the breath ventilation hole 56B, which is provided in the partition wall 51B and includes the first and second ventilation holes 56a and 56b, except for a contour outer peripheral portion of the outer surface portion 55b.

A throttling hole portion 57d is provided at each of depth portions of the first and second ventilation holes 56a and 56b so as to communicate with the outer surface portion 55b of the water-repellent filter 55B.

The atmospheric opening end of the breath ventilation hole 56B in this embodiment is surrounded by water barrier walls 58B at three sides, and side surface walls of the first and second annular peripheral walls 54a and 54b also serve as the water barrier walls 58B at two of the three sides as shown in FIG. 10.

The poured water blocking wall 57B is provided at upper portions of the water barrier walls 58B at the three sides to block poured water in a first direction from a cover 30B side plane to a base 20B side plane. One end of a cavity portion 58d formed by the outer wall surface of the partition wall 51B, the water barrier walls 58B, and the poured water blocking wall 57B is opened, and the apparatus having this configuration is referred to as "regular product".

An annular projection surface 56z is provided at the opening end of the cavity portion 58d, and the atmospheric opening end of the breath ventilation hole 56B in the cavity portion 58d is provided in a plateau plane portion 56y.

When the direction of an insert of a mold for manufacturing the connector housing 50B is made opposite, a "mirror-image product" can be obtained in which the poured water blocking wall 57B is provided at a lower portion and the opening end of the cavity portion 58d is located at the upper portion side.

Therefore, positions of the ventilation opening with respect to various mounting angles are the same as in FIGS. 7 and 8, and if either the "regular product" or the "mirror-image product" is selected for each of the various mounting directions of the waterproof type control apparatus 10B, the water-repellent filter 55B can be prevented from being wetted with water.

However, in the cases of the diagrams 110, 160, and 170 shown in FIG. 7 and in the cases of the diagrams 200, 240, and 250 shown in FIG. 8, water is accumulated in the cavity portion 58d, and thus this mounting direction is inappropriate.

When the ventilation test is conducted on the water-repellent filter 55B, a pressurizing or depressurizing device is connected in the outer annular peripheral wall 54B of the connector housing 50B in a state where the mating connector 12B is not connected, the interior of the casing 11B is pressurized or depressurized through the fine hole 59 that is the same as in FIG. 2, and a ventilation volume is measured in a state where the opening end of the cavity portion 58d is closed or opened.

In FIGS. 12A and 12B, similarly to the connector housing 50B in FIG. 11, the connector housing 50C includes the partition wall 51C, a first connection terminal 52C, an inner annular peripheral wall 53C, the outer annular peripheral wall 54C including first and second annular peripheral walls 54a and 54b (see FIG. 11), a water-repellent filter 55C having an inner surface portion 55a and an outer surface portion 55b, a breath ventilation hole 56C including first and second ventilation holes 56a and 56b and respective throttling hole portions 56d, a poured water blocking wall 57C, water barrier walls 58C at three sides, and the cavity portion 58d. The difference from the connector housing 50B in FIG. 11 is that the direction in which the first and second ventilation holes 56a and 56b are arranged is changed from the up-down direction to the right-left direction and a cavity partition wall 58e is provided at an intermediate portion between the first and second ventilation holes 56a and 56b.

The annular projection surface 56z is provided at the opening end surface of the cavity portion 58d formed by the outer wall surface of the partition wall 51B or 51C, the water barrier walls 58B or 58C at the three sides, and the poured water blocking wall 57B or 57C, and a ventilation test in Embodiment 2 is performed while a test jig that blocks or allows ventilation between the interior and the exterior of the casing through the breath ventilation hole 56B or 56C is brought into contact with the annular projection surface 56z. The test jig may directly close or open the opening end of the breath ventilation hole 56B or 56C similarly as in Embodiment 1.

On the other hand, an annular projection surface may be provided at the opening end surface and a half-opening end surface of the cavity portion 58d formed by the outer wall surface of the partition wall 51A, the water barrier walls 58A at the three sides, and the poured water blocking wall 57A, and a ventilation test in Embodiment 1 may be conducted while a test jig that blocks or allows ventilation between the interior and the exterior of the casing through the breath ventilation hole 56A is brought into contact with the annular projection surface. The half-opening end surface described here is an end surface at a side including the poured water blocking wall 57A provided on the partition wall 51A so as to project therefrom and be spaced apart from the water barrier walls 58A at the three sides at a small gap, and a ventilation test may be conducted such that one of a pair of test jigs, for example, closes the opening end surface, and the other jig opens or closes the half-opening end surface.

(3) Main Points and Features of Embodiment 2

As is obvious from the above description, the waterproof type control apparatus 10B according to Embodiment 2 of the present invention includes: the circuit board 40 that is sealed and housed in the casing 11B that includes the base 20B having the mounting surface and the cover 30B; the connector housing 50B that is a resin molded member that is mounted at the one side of the circuit board 40 and exposed from a side surface opening of the cover 30B; and the plurality of first connection terminals 52B or 52C that are press-fitted into the partition wall 51B or 51C of the connector housing 50B or 50C. The one end of each first connection terminal 52B or 52C is connected to a circuit pattern of the circuit board 40, and the other end of each first connection terminal 52B or 52C is connected in a contact conductive manner to the second connection terminal 14 provided within the mating connector 12B, so that the waterproof type control apparatus 10B is connected to the wire harness 60B that is outside the casing 11B. The connector housing 50B or 50C includes the outer annular peripheral wall 54B or 54C that is provided at the outer side of the partition wall 51B or 51C and to which the mating connector 12B is fitted, and the waterproof packing 15 for preventing water from entering the closed space including a contact conductive portion between each first connection terminal 52B or 52C and each second connection terminal 14 is provided between an end surface portion of the outer annular peripheral wall 54B or 54C and the mating connector 12B.

The water-repellent filter 55B or 55C is fixed in a close contact manner to the inner wall of the partition wall 51B or 51C, and is a flat porous material that includes a plurality of fine pores that block entry and passing of water droplets into the casing 11B and allow the atmospheric air to freely pass therethrough. The water-repellent filter 55B or 55C includes: the inner surface portion 55a that communicates with the inner space of the casing 11B; and the outer surface portion 55b that communicates with the breath ventilation hole 56B through which the outside air is introduced. At the breath ventilation hole 56B or 56C, the water barrier walls 58B or 58C are disposed at three sides of an atmospheric opening surface penetrating the partition wall 51B or 51C, and the poured water blocking wall 57B or 57C is disposed which fully blocks either one of poured water in the first direction flowing from the cover 30B side plane to the base 20B side plane or poured water in the second direction flowing from the base 20B side plane to the cover 30B side plane and releases the other poured water. The regular product in which the poured water blocking wall 57B or 57C fully blocks the poured water in the first direction or the mirror-image product in which the poured water blocking wall 57B or 57C fully blocks the poured water in the second direction is used depending on whether the base 20B is mounted on a floor surface or a ceiling surface.

As described above, the waterproof type control apparatus according to the present invention includes the circuit board 40 housed in the sealed casing 11B and the connector housing 50B or 50C exposed from one side of the sealed casing 11B, the first connection terminals 52B or 52C each having one end connected to the circuit board 40 and another end that is brought into electrically conductive contact with the second connection terminal 14 within the mating connector 12B are press-fitted and fixed to the partition wall 51B or 51C of the connector housing 50B or 50C, and the water-repellent filter 55B,55C which is the flat porous material, is fixed in a close contact manner to the partition wall 51B or 51C of the connector housing 50B or 50C. The poured water blocking wall 57B or 57C and the water barrier walls 58B or 58C at the three sides are provided at the breath ventilation hole 56B or 56C orthogonal to the partition wall 51B or 51C, and the outer surface portion of the water-repellent filter 55B or 55C is opened to the atmosphere. This relates to claim 1.

Therefore, since the water-repellent filter 55B or 55C is mounted on the inner surface of the connector housing 50B or 50C, a functional test can be conducted on the apparatus alone, and also there is an effect that the area of the water-repellent filter 55B or 55C can be increased to reduce the air pressure difference between the interior and the exterior, as compared to the case where the water-repellent filter 55B or 55C is provided within the mating connector 12B.

In addition, the mounting structure becomes simpler and cheaper than one in which the water-repellent filter 55B or 55C is provided to a specially provided intermediate wall of a cover, so that there is an effect that a cover made of a resin or a sheet metal can be used.

In addition, the position and the direction of the poured water blocking wall 57B or 57C can be selected by changing an insertion position of an insert relative to a mold dedicated for the regular product or the mirror-image product or a shared mold, the breath ventilation hole 56B or 56C can be formed by the molded structure of the connector housing 50B or 50C, and the mounting environment can be handled by using the water-repellent filter 55B or 55C having a simple configuration such that wetting directly by water from the atmospheric opening surface is avoided. Thus, there is an effect that in either case, the common base and cover can be used.

Furthermore, the breath ventilation hole 56B or 56C and the water barrier wall 58B or 58C are located such that either of the breath ventilation hole 56B or 56C or the water barrier wall 58B or 58C becomes an upward hole or a upward surface, so that there is an effect that the water-repellent filter 55B or 55C can be avoided from being wetted directly with water. In addition, the breath ventilation hole 56B or 56C and the structure of the poured water blocking wall 57B or 57C and the water barrier wall 58B or 58C do not depend on the structure of the mating connector 12B. Thus, the mating connector can be used in common for the connector housing 50B or 50C in which the water-repellent filter 55B or 55C is mounted and a conventional-type connector housing in which a water-repellent filter is not mounted, so that there is an economical effect that it is not necessary to additionally produce a new mold.

In the waterproof type control apparatus 10B according to Embodiment 2 of the present invention, further, the outer annular peripheral wall is the division-type outer annular peripheral wall 54B or 54C that is divided into the first and second annular peripheral walls 54a and 54b, the mating connector 12B is also a division-type connector that is divided into the first and second mating connectors 12a and 12b, and the water barrier walls 58B or 58C are provided at an intermediate position between the outer annular peripheral wall 54B or 54C that is divided into a plurality of sections, and are provided at a position away from an outer wall surface of the outer annular peripheral wall 54B or 54C, or are provided at a position that is at a depth portion of the inserted mating connector 12B and is away from an opening end of the outer annular peripheral wall 54B or 54C, such that insertion of the mating connector 12B is not hindered.

As described above, in connection with claim 3 of the present invention, the poured water blocking wall 57B or 57C and the water barrier walls 58B or 58C at the three sides are restricted to a position where insertion of the mating connector 12B is not hindered.

Therefore, there is a feature that the water barrier walls 58B or 58C can be provided adjacently to the vicinity of the connector provided at an advantageous location where consideration is given such that wetting directly with water is avoided.

In addition, since the breath ventilation hole 56B or 56C and the poured water blocking wall 57B or 57C are present between the right and left mating connectors 12B, wetting directly with water is more unlikely to occur.

In addition, when the water barrier walls 58B or 58C at the three sides are provided at a position away from the opening end of the outer annular peripheral wall 54B or 54C such that insertion of the mating connector is not hindered, the side surface portion of the outer annular peripheral wall 54B or 54C can be used as one of the water barrier walls.

In the waterproof type control apparatus 10B according to Embodiment 2 of the present invention, further, the opening end of the breath ventilation hole 56B or 56C is provided in the plateau plane portion 56y which projects from the outer wall surface of the partition wall 51B or 51C, or the annular projection surface 56z is provided at the opening end of the water barrier walls 58B at the three sides, one end of which is closed by the poured water blocking wall 57B or 57C, so as to surround the opening end. This relates to claim 8 of the present invention.

Accordingly, when a ventilation test is conducted on the water-repellent filter 55B or 55C, if an elastic body is provided on a contact face of a jig for closing or opening the opening end of the breath ventilation hole or the opening end of the water barrier walls 58B or 58C, air-tight closing can be easily performed.

In addition, there is a feature that even when a small amount of water flows on the partition wall 51B or 51C that is in a horizontal state, if the opening of the breath ventilation hole 56B or 56C is provided in the plateau plane portion 56y, the water does not flow into the breath ventilation hole 56B or 56C.

It is noted that, within the scope of the present invention, the above embodiments may be freely combined with each other, or each of the above embodiments may be modified or abbreviated as appropriate.

DESCRIPTION OF THE REFERENCE CHARACTERS 10A, 10B waterproof type control apparatus
11A, 11B casing
12A, 12B mating connector
12x inner body portion
12y outer peripheral wall
14 second connection terminal
15 waterproof packing
20A, 20B base
30A, 30B cover
40 circuit board
50A, 50B, 50C connector housing
51A, 51B, 51C partition wall
52A, 52B, 52C first connection terminal
53A, 53B, 53C inner annular peripheral wall
54A, 54B, 54C outer annular peripheral wall
55A, 55B, 55C water-repellent filter
56A, 56B, 56C breath ventilation hole
57A, 57B, 57C poured water blocking wall
56d throttling hole portion
56z annular projection surface
56x, 56y plateau plane portion
58A, 58B, 58C water barrier wall
59 fine hole
60A, 60B wire harness

What is claimed is:

1. A waterproof type control apparatus comprising:
a circuit board sealed and housed in a casing including a cover and a base having a mounting surface;
a connector housing which is a resin molded member mounted at one side of the circuit board and exposed from a side surface opening of the cover; and
a plurality of first connection terminals press-fitted into a partition wall of the connector housing, wherein
one end of each first connection terminal is connected to the circuit board, and another end of each first connection terminal is connected in a contact conductive manner to a second connection terminal provided within a mating connector, so that the waterproof type control apparatus is connected to a wire harness which is outside the casing,
the connector housing includes an outer annular peripheral wall which is provided at an outer side of the partition wall and to which the mating connector is fitted,
a waterproof packing for preventing water from entering a closed space including a contact conductive portion between each first connection terminal and each second connection terminal is provided between an end surface portion of the outer annular peripheral wall and the mating connector,
a water-repellent filter which is a flat porous material including a plurality of fine pores which block entry and passing of water droplets into the casing and allow atmospheric air to freely pass therethrough is fixed in a close contact manner to an inner wall of the partition wall,
the water-repellent filter includes an inner surface portion communicating with an inner space of the casing and an outer surface portion communicating with a breath ventilation hole through which outside air is introduced,
at the breath ventilation hole, water barrier walls are disposed at three sides of an atmospheric opening surface penetrating the partition wall, and a poured water blocking wall is disposed which at least partially blocks either one of poured water in a first direction flowing from a cover side plane to a base side plane or poured water in a second direction flowing from the base side plane to the cover side plane and releases the other poured water, and the poured water blocking wall at least partially blocks one of the poured water in the first direction or the poured water in the second direction based on whether the base is mounted on a floor surface or a ceiling surface, wherein a throttling hole portion is provided such that a hole diameter of the breath ventilation hole is small at a position of a depth portion thereof that communicates with the outer surface portion of the water-repellent filter.

2. The waterproof type control apparatus according to claim 1, where the poured water blocking wall is an eave portion which is provided on the partition wall so as to project therefrom and be spaced apart from the water barrier walls at the three sides at a small gap for the partial blocking, and of which a cross-sectional shape is a U shape, a trapezoidal shape, a triangular roof shape, or a flat plate shape.

3. The waterproof type control apparatus according to claim 1, wherein the outer annular peripheral wall is a single annular peripheral wall or a division type outer annular peripheral wall divided into at least first and second annular peripheral walls, the mating connector is also a single mating connector or a division type mating connector divided into at least first and second mating connectors, and the water barrier walls are provided at a position at a side surface of the single outer annular peripheral wall or at an intermediate position of the outer annular peripheral wall divided into a plurality of sections, and are provided at a position away from an outer wall surface of the outer annular peripheral wall, or are provided at a position which is at a depth portion of the inserted mating connector and is away from an opening end of the outer annular peripheral wall, such that insertion of the mating connector is not hindered.

4. The waterproof type control apparatus according to claim 1, wherein the plurality of first connection terminals are arranged at a plurality of stages in a direction orthogonal to a board surface of the circuit board, the breath ventilation hole includes a first ventilation hole and a second ventilation hole which are located in a vertical direction orthogonal to the board surface of the circuit board or a horizontal direction parallel to the board surface, ends of the first ventilation hole and the second ventilation hole communicate with the outer surface portion of the water-repellent filter, and other ends of the first ventilation hole and the second ventilation hole are opened to atmosphere, and the poured water blocking wall is shared by the first ventilation hole and the second ventilation hole.

5. The waterproof type control apparatus according to claim 1, wherein the throttling hole portion is located eccentrically from a central position of the breath ventilation hole, and is located eccentrically in such a direction that a portion for accumulating poured water is widened in response to a predetermined mounting inclination angle.

6. The waterproof type control apparatus according to claim 1, wherein an opening end of the breath ventilation hole is provided in a plateau plane portion which projects from an outer wall surface of the partition wall, or an annular projection surface is provided at an opening end of the water barrier walls at the three sides, one end of which is closed by the poured water blocking wall, so as to surround the opening end.

7. The waterproof type control apparatus according to claim 1, wherein the partition wall is provided with a fine hole communicating between the inner space of the casing and said closed space.

* * * * *